(12) United States Patent
Inao et al.

(10) Patent No.: US 8,297,331 B2
(45) Date of Patent: Oct. 30, 2012

(54) SEPARATING APPARATUS AND SEPARATING METHOD

(75) Inventors: Yoshihiro Inao, Kawasaki (JP); Akihiko Nakamura, Kawasaki (JP); Yasumasa Iwata, Kawasaki (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 43 days.

(21) Appl. No.: 12/492,620

(22) Filed: Jun. 26, 2009

(65) Prior Publication Data

US 2010/0000680 A1    Jan. 7, 2010

(30) Foreign Application Priority Data

Jul. 2, 2008   (JP) ................................ 2008-173842

(51) Int. Cl.
  *B32B 38/10*   (2006.01)
(52) U.S. Cl. ........ 156/757; 156/704; 156/707; 156/708; 156/758; 156/930
(58) Field of Classification Search ............... 156/704, 156/707, 708, 757, 758, 930
See application file for complete search history.

(56) References Cited

U.S. PATENT DOCUMENTS

| 4,721,462 A * | 1/1988 | Collins, Jr. .................... 432/253 |
| 6,272,989 B1 * | 8/2001 | Misono et al. ................. 101/474 |
| 7,406,759 B2 * | 8/2008 | Yamamoto et al. ............. 29/559 |
| 2002/0129899 A1 * | 9/2002 | Mimata et al. ................. 156/344 |
| 2003/0015286 A1 * | 1/2003 | De et al. ........................ 156/344 |
| 2007/0054470 A1 * | 3/2007 | Nakamura et al. ............. 438/459 |
| 2007/0062644 A1 * | 3/2007 | Nakamura et al. ............. 156/344 |
| 2008/0041523 A1 * | 2/2008 | Kamei et al. ................... 156/344 |
| 2011/0146899 A1 | 6/2011 | Nakamura et al. |

FOREIGN PATENT DOCUMENTS

| JP | 11-111824 | 4/1999 |
| JP | 11-116046 | 4/1999 |
| JP | 2006-032506 | 2/2006 |
| JP | 2007-067167 | 3/2007 |

* cited by examiner

*Primary Examiner* — Mark A Osele
*Assistant Examiner* — Nickolas Harm
(74) *Attorney, Agent, or Firm* — Wenderoth, Lind & Ponack, L.L.P.

(57) ABSTRACT

A separating apparatus includes a sucking plate for sticking to a support plate by suction. The sucking plate has sucking holes for expelling gas from a space between the sucking plate and the support plate. Each of the sucking holes has a diameter of not less than 0.3 mm and not more than an outer diameter of the support plate. This makes it possible to separate a supporting plate from a wafer without breaking the wafer.

8 Claims, 3 Drawing Sheets

SEPARATING APPARATUS AND SEPARATING METHOD

This Nonprovisional application claims priority under 35 U.S.C. §119(a) on Patent Application No. 2008-173842 filed in Japan on Jul. 2, 2008, the entire contents of which are hereby incorporated by reference.

BACKGROUND OF THE INVENTION

I. Technical Field

The present invention relates to a separating apparatus and a separating method by each of which a supporting plate is separated from a substrate to which the supporting plate has been attached.

II. Description of the Related Art

As mobile phones, digital AV devices, IC cards and the like are highly functionalized, there is a growing demand for miniaturizing and thinning semiconductor silicon chips (hereafter referred to as "chips") to be mounted and thereby highly integrating the chips in a package. In order to fulfill high integration of chips in a package, it is necessary to reduce the thickness of each chip to a range of 25 to 150 μm.

However, a semiconductor wafer (hereafter referred to as "wafer") on which chips are based is thinned by grinding, and therefore the wafer decreases in strength. This decrease in strength is likely to cause a crack or warpage in the wafer. Furthermore, it is difficult to automatically convey such a wafer having decreased strength due to a decrease in thickness. Therefore, it is necessary to manually convey the wafer, and it is troublesome to handle the wafer.

For this reason, a wafer support system has been developed for keeping the strength of a wafer by attaching a support plate to a wafer to be ground and for thereby preventing a crack and warpage in the wafer. The "support plate" here means a plate composed of glass, hard plastic, or the like. The wafer support system makes it possible to keep the strength of a wafer. This makes it possible to automatically convey a semiconductor wafer having been made thinner.

The support plate is attached to the wafer with use of adhesive tape, a thermoplastic resin, an adhesive, or the like. After the wafer to which the support plate has been attached is made thinner, the support plate is separated from the wafer before the wafer is diced. In cases where the wafer is separated from the support plate, the wafer is usually separated from the support plate by ripping down the wafer from the support plate or by dissolving the resin or the adhesive with which the wafer has been attached to the support plate.

For example, Japanese Patent Application Publication, Tokukaihei, No. 11-111824 A (Publication Date: Apr. 23, 1999) discloses a method for separating a wafer from a support plate by inserting a blade edge of a scraper between the wafer and the support plate and moving the blade edge of the scraper along a surface of the support plate so as to remove the adhesive with which the wafer has been attached to the support plate. Furthermore, Japanese Patent Application Publication, Tokukai, No. 2006-32506 A (Publication Date: Feb. 2, 2006) discloses a method for separating a wafer from a support plate while preventing adhesion between the wafer and the support plate due to closure of an interface where the support plate is separated from the wafer, by inserting a blade into an adhesive material with which the support plate has been attached to the wafer and vibrating the adhesive material while biasing the wafer in a direction away from the support plate.

SUMMARY OF THE INVENTION

When a support plate is separated from a wafer having been made thinner, it is necessary to be careful not to break the wafer having been made thinner. However, since both of the methods disclosed in Japanese Patent Application Publication, Tokukaihei, No. 11-111824 A and Japanese Patent Application Publication, Tokukai, No. 2006-32506 A involve the insertion of a blade between a wafer and a support plate, it is highly possible that the wafer will be broken when the blade is inserted. Moreover, an extremely high level of location accuracy is required for securely inserting a blade between a wafer having been made thinner and a support plate. Therefore, there is a demand for the development of an apparatus capable of easily separating a support plate from a wafer without breaking the wafer.

The present invention has been made in consideration of the aforementioned problems. It is an object of the present invention to provide a separating apparatus and a separating method by each of which a support plate can be separated from a wafer to which the support plate has been attached.

A separating apparatus for separating a supporting plate from a substrate to which the supporting plate has been attached, includes a sucking means or device for sticking to the supporting plate by suction, the sucking means having an opening via which gas is expelled from a space between the sucking means and the supporting plate, the opening having a diameter of not less than 0.3 mm and not more than an outer diameter of the supporting plate.

A separating method for separating a supporting plate from a substrate to which the supporting plate has been attached, includes the steps of: dissolving an adhesive with which the supporting plate has been attached to the substrate; and separating the supporting plate from the substrate after the dissolving step by sticking to the supporting plate by suction.

A separating apparatus according to the present invention includes a sucking means or device for sticking to the supporting plate by suction, the sucking means having an opening via which gas is expelled from a space between the sucking means and the supporting plate, the opening having a diameter of not less than 0.3 mm and not more than an outer diameter of the supporting plate, and therefore can easily separate the supporting plate from a substrate to which the supporting plate has been attached, without breaking the substrate.

For a fuller understanding of the nature and advantages of the invention, reference should be made to the ensuing detailed description taken in conjunction with the accompanying drawings.

DESCRIPTION OF EMBODIMENTS

[Embodiment 1]

(Separating Apparatus 1)

Figure 1:
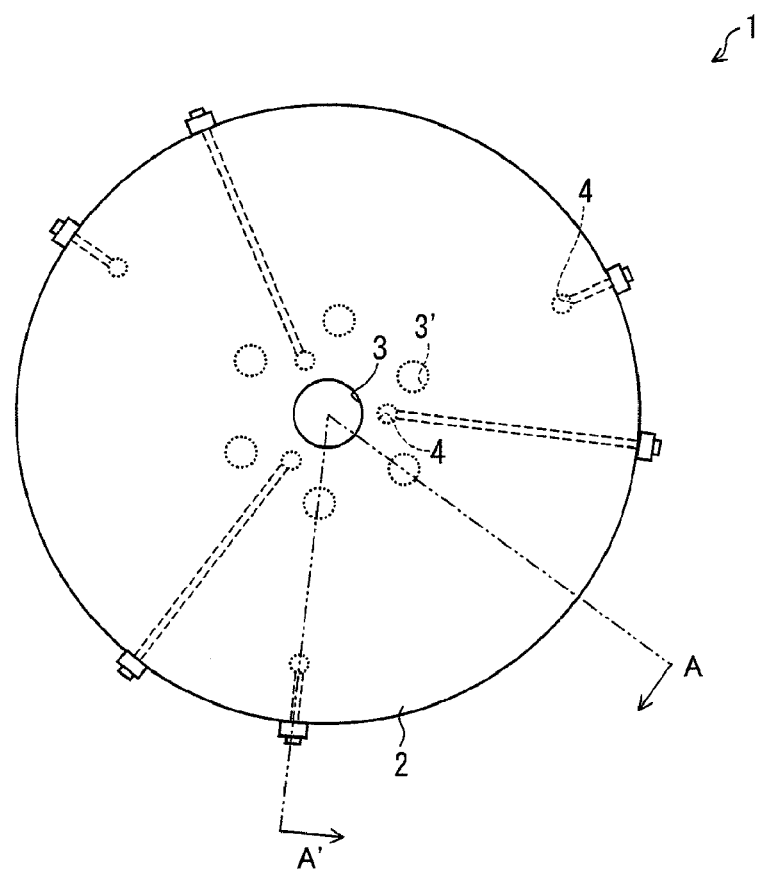
FIG. 1 is a top view of a separating apparatus according to Embodiment 1.
Figure 2:
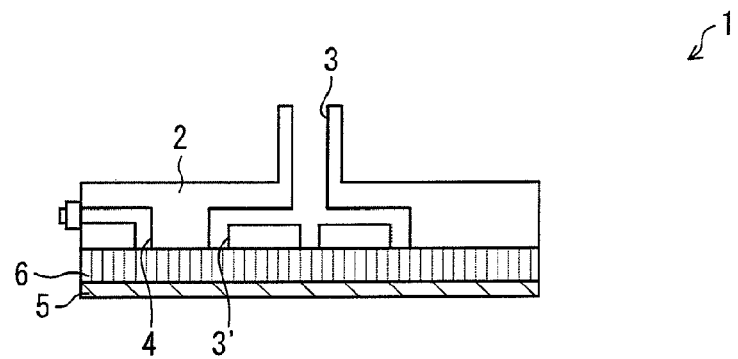
FIG. 2 is a cross-sectional view taken along the line A-A' of FIG. 1.

A separating apparatus 1 according to an embodiment of the present invention is described below with reference to FIGS. 1 to 3. FIG. 1 is a top view of a separating apparatus 1 according to Embodiment 1. FIG. 2 is a cross-sectional view of the separating apparatus of FIG. 1 taken along the line A-A' line. Furthermore, in FIG. 3, (a) to (f) are cross-sectional views illustrating steps of a separating method according to the present embodiment. As illustrated in FIGS. 1 and 2, the separating apparatus 1 includes a sucking plate or device (sucking means) 2. The sucking plate 2 is provided with a sucking hole (opening) 3 and a gas supply means or device having a gas inlet 4. As illustrated in FIG. 2, the separating apparatus 1 is provided so as to face a support plate (supporting plate) 6, attached to a wafer (substrate) 5, which is an object to be processed.

(Sucking Plate 2)

The sucking plate 2, which has a contact surface that makes contact with the support plate 6, holds the support plate 6 by suction and separates the support plate 6 from the wafer 5. It is preferable that the contact surface of the sucking plate 2 be substantially identical in planar shape to the support plate 6. As illustrated in FIGS. 1 and 2, the sucking plate 2 is provided with sucking holes 3 and 3' via which gas is expelled from a space between the sucking plate 2 and the support plate 6.

The sucking holes 3 and 3' are provided so as to pass through the sucking plate 2 so that the sucking hole 3 is in communication with the sucking hole 3' provided in a surface of the sucking plate 2 which surface faces the support plate 6. The sucking holes 3 and 3', via which the gas is sucked from the space between the sucking plate 2 and the support plate 6, serve to cause the support plate 6 to be held by the suction power with which the gas is sucked. Each of the sucking holes 3 and 3' has a diameter of not less than 0.3 mm and not more than the outer diameter of the support plate 6. Moreover, it is preferable that each of the sucking holes 3 and 3' have a diameter of not less than 0.3 mm and not more than 20 mm.

The sucking hole 3, provided in a surface of the sucking plate 2 opposite to its surface that faces the support plate 6, is connected to sucking means such as an injector (not illustrated). Specifically, this sucking means is operated to suck the gas from the space between the sucking plate 2 and the support plate 6 via the sucking hole 3' and exhaust the gas via the sucking hole 3, whereby the gas is expelled from the space between the sucking plate 2 and the support plate 6 and the support plate 6 is held by the suction power with which the gas is expelled.

As illustrated in FIG. 1, in the present embodiment, the sucking hole 3, provided in a surface of the sucking plate 2 opposite to its surface that faces the support plate 6, is communicated with three sucking holes 3' provided in the surface of the sucking plate 2 which surface faces the support plate 6. A sucking hole 3, provided in the surface of the sucking plate 2 opposite to its surface that faces the support plate 6, and a sucking hole 3', provided in the surface of the sucking plate 2 which surface faces the support plate 6, may form a single through hole. Further, it is possible to provide a plurality of such through holes. Moreover, it is preferable that the sucking holes 3 and 3' be provided in the vicinity of the center of the sucking plate 2. However, the sucking holes 3 and 3' are not particularly limited in location where they are provided, as long as the support plate 6 can be suitably held by suction.

The separating apparatus 1 separates the support plate 6 from the wafer 5 by moving the sucking plate 2, which is sticking to the support plate 6 by suction, away from the wafer 5. This allows easily separating the support plate 6 without putting stress on the wafer 5, and preventing the wafer from being broken when the support plate 6 is separated.

Moreover, the separating apparatus 1 may further include dissolving liquid supply means (not illustrated) for supplying a dissolving liquid for dissolving an adhesive with which the support plate 6 has been attached to the wafer 5. The separating apparatus 1 is arranged to separate the support plate 6 from the wafer 5 by causing the sucking plate 2 to stick by suction to the support plate 6 at which the adhesive has been dissolved by the dissolving liquid supplied.

In the present embodiment, the support plate 6 has a plurality of through holes passing therethrough in a thickness direction thereof. Gas to be supplied to the support plate 6 via the gas inlet 4 provided in the sucking plate 2 as the gas supply means is supplied into a space between the support plate 6 and the wafer 5 via the through holes.

In the present embodiment, the gas inlet 4 is provided so as to pass through the sucking plate 2 from a side surface of the sucking plate 2 to the surface of the sucking plate 2 which surface makes contact with the support plate 6. However, the gas inlet 4 may be provided so as to pass through the sucking plate 2 from (i) a surface of the sucking plate 2 opposite to the contact surface of the sucking plate 2 to (ii) the contact surface of the sucking plate 2, as long as the gas inlet 4 is provided in a position where the gas can be supplied without prevention of suction via the sucking holes 3 and 3'. Furthermore, in the present embodiment, the gas inlet 4 is provided so that the gas is supplied from the vicinity of the center of the sucking plate 2 and from the vicinity of the outer periphery thereof. However, the gas inlet 4 is not limited in location where it is provided, as long as the gas is suitably supplied to the space between the support plate and the wafer 5.

By supplying the gas into the space between the support plate 6 and the wafer 5 via the gas inlet 4, surface tension therebetween by an adhesive-dissolving liquid or the like can be removed. It is preferable that the separating apparatus 1 be arranged such that after or at the same time as the sucking plate 2 sticks to the support plate 6 by suction, the sucking plate 2 separates the support plate 6 from the wafer 5 by supplying gas from the supply means. This makes it possible to easily separate the support plate 6 from the wafer 5.

The gas to be supplied via the gas inlet 4 is not particularly limited provided that it is a gas capable of applying a certain pressure between the support plate 6 and the wafer 5 when blown therebetween, but is preferably an inert gas. The inert gas can be suitably realized by a publicly-known inert gas such as nitrogen or argon. As for a method for supplying the gas via the gas inlet 4, it is preferable to supply the gas at such a flow rate that the wafer 5 is not broken. Furthermore, the gas supply means having the gas inlet 4 does not need to be provided in the sucking plate 2, but may be included in the separating apparatus 1 as independent gas supply means provided that the gas can be supplied into the space between the support plate 6 and the wafer 5.

With the separating apparatus 1 according to the present embodiment, the sucking plate 2 having the sucking holes 3 and 3', each of which has a diameter of not less than 0.3 mm and not more than the outer diameter of the support plate 6, holds the support plate 6 by suction and separates the support plate 6 from the wafer 5. With the separating apparatus 1, by sticking to the support plate 6 by the suction power with which the gas is expelled from the space between the support plate 6 and the sucking plate 2, the support plate 6 can be held with the same or more powerful force than in a case where the support plate 6 is held by suction with the use of decompression by a vacuum pump or the like, for example.

Generally, in sticking to the support plate 6 by suction with the use of decompression by a vacuum pump or the like, sucking means for sticking to the support plate 6 by suction is provided with an opening via which gas is expelled from a space between the support plate 6 and the sucking means, and the opening has a diameter of about 1 mm. For example, by expelling the gas from the space between the support plate 6 and the sucking means at a flow rate of 0.1 m/s, the space is decompressed, so that the sucking means sticks to the support plate 6 by suction. Since the flow rate of a vacuum pump is low, it is difficult to stick to the support plate 6 unless the space between the sucking means and the support plate 6 is sealed and a differential pressure between the sealed space and the outside thereof is increased. Accordingly, in the case of use of a vacuum pump, the creation of such a sealed space requires that a section of the support plate 6 which section corresponds to the opening provided in the sucking means be flat. Therefore, it is impossible to apply a vacuum pump to such a support plate 6 having through holes formed in an entire surface thereof.

In this way, in sticking to the support plate 6 by suction with the use of decompression, it is necessary to use a support plate 6 which has a section having no through hole formed therein. In such a support plate 6, for example, when a dissolving liquid is supplied from a side of the support plate 6 via a through hole to an adhesive with which the support plate 6 has been attached to the wafer 5, the dissolving liquid is not rapidly supplied to that portion of the adhesive which is in contact with the section having no through hole formed therein. Therefore, the dissolving liquid requires a long time for permeation. As a result, it takes a long time to separate the support plate 6 from the wafer 5.

On the other hand, in the separating apparatus 1 according to the present invention, the sucking plate 2 is provided with the sucking holes 3 and 3', each of which has a diameter of not less than 0.3 mm and not more than the outer diameter of the support plate 6. For example, by expelling the gas from the space between the support plate 6 and the sucking plate 2 at a flow rate of 22.0 m/s, the support plate 6 can be held by suction with the same or more powerful force than in the case of use of the aforementioned decompression. Moreover, in the separating apparatus 1 according to the present invention, the support plate 6 is held by the suction power with which the gas is expelled from the space between the support plate 6 and the sucking plate 2 via the sucking holes 3 and 3'. This makes it unnecessary to decompress the space between the sucking plate 2 and the support plate 6. Accordingly, the separating apparatus 1 according to the present invention can be used to separate, from the wafer 5, the support plate 6 having through holes formed in an entire surface thereof as well as in sections corresponding to the sucking holes 3 and 3'.

In this way, the support plate 6 having through holes formed in an entire surface thereof is usable. Therefore, a dissolving liquid for dissolving an adhesive with which the support plate 6 has been attached to the wafer 5 can be more efficiently supplied to the adhesive by supplying the dissolving liquid via the through holes from a surface of the support plate 6 opposite to its surface that faces the wafer 5. As a result, the adhesive can be more rapidly dissolved, and the support plate 6 can be separated from the wafer 5 in a shorter time.

A separating method according to the present embodiment is described below with reference to (a) to (f) of FIG. 3. In FIG. 3, (a) to (f) are cross-sectional views illustrating steps of the separating method according to the present embodiment. The separating method according to the present embodiment includes at least the steps of: dissolving an adhesive with which the support plate 6 has been attached to the wafer 5; and separating the support plate 6 from the wafer 5 after the dissolving step. Moreover, it is preferable that the separating method further include the step of supplying gas into a space between the wafer 5 and the support plate 6 after or at the same time as sticking to the support plate 6 by suction. In this case, the support plate 6 is separated from the wafer 5 after the gas starts being supplied.

Figure 3:
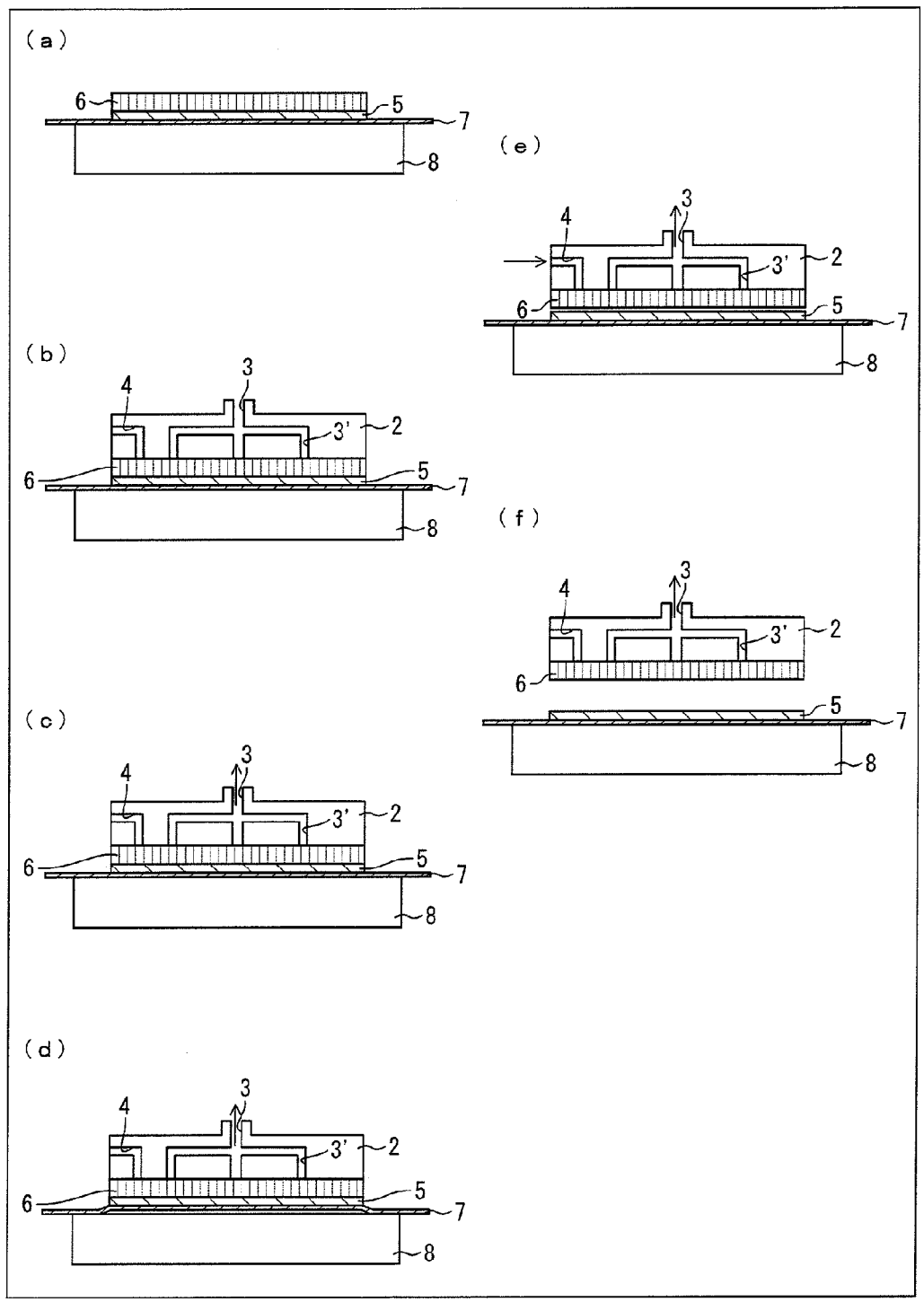
FIG. 3 shows cross-sectional views illustrating steps of a separating method according to Embodiment 1.

In the present separating method, as illustrated in (a) in FIG. 3, the wafer 5 to which the support plate 6 has been attached is mounted on a stage 8. At this time, the adhesive with which the support plate 6 has been attached to the wafer 5 is dissolved by a dissolving liquid infused thereinto. The dissolution of the adhesive can be realized, for example, by infusing the dissolving liquid from an upper side of the support plate 6 (i.e., a side of the support plate 6 opposite to the wafer 5) via a through hole of the support plate 6. It should be noted here that "the dissolution of the adhesive" also encompasses a case where the adhesive is partially dissolved, as well as a case where the adhesive is completely dissolved.

Furthermore, to a surface of the wafer 5 opposite to its surface that is in contact with the support plate 6, a dicing tape 7 is attached. The dicing tape 7 is a member for holding a substrate. A laminate constituted by the wafer 5, the support plate 6, and the dicing tape 7 is mounted on the stage 8 so that the dicing tape 7 makes contact with the stage 8 and the support plate 6 is located farthest from the stage 8. This laminate is fixed on the stage 8. Specifically, the dicing tape 7 in contact with the stage 8 is held by decompression suction.

Next, as illustrated in (b) in FIG. 3, the sucking plate 2 having the sucking holes 3 and 3' is placed above the support plate 6 so that the support plate 6 and the sucking plate 2 face each other. Then, the support plate 6 and the sucking plate 2 are brought into contact with or close proximity to each other. It should be noted here that each of the sucking holes 3 and 3' has a diameter of not less than 0.3 mm and not more than the outer diameter of the support plate 6.

Then, as illustrated in (c) in FIG. 3, the gas is expelled by suction from the space between the sucking plate 2 and the support plate 6 via the sucking holes 3 and 3', and the support plate 6 is held by sticking the support plate 6 to the sucking plate 2 by the suction power with which the gas is expelled.

Subsequently, as illustrated in (d) in FIG. 3, the decompression suction of the dicing tape 7 is partially released. Specifically, the sticking of an inner peripheral side of the stage 8 by decompression suction is released. By this, that portion of the dicing tape 7 which is located so as to correspond to the inner peripheral side of the stage 8 is slightly raised from the stage 8. This can be realized by stopping the operation of decompression means (e.g., a vacuum pump) of the stage 8. At this time, decompression means on an outer peripheral side of the stage 8 remains operated and thus the sticking between the dicing tape 7 and the outer peripheral side of the stage 8 by decompression suction is continued.

Next, as illustrated in (e) in FIG. 3, an inert gas such as nitrogen is supplied into the space between the wafer 5 and the support plate 6 via the gas inlet 4, which is the gas supply means. With this, the surface tension between the wafer 5 and the support plate 6 can be removed. Subsequently, the dicing tape 7 is fixed to the stage 8 again by suction. Specifically, the sticking of the inner peripheral side of the stage 8 by suction is started. With this step, the support plate 6 held by the sucking plate 2 by suction is spaced from the wafer 5.

Then, as illustrated in (f) in FIG. 3, the sucking plate 2 holding the support plate 6 by suction is lifted. With this, the wafer 5 and the support plate 6 are completely spaced and thus the support plate 6 can be separated from the wafer 5. In this step, the sucking plate 2 holding the support plate 6 is lifted, for example, by an arm connected to the sucking plate 2.

[Embodiment 2]

(Separating Apparatus 10)

Figure 4:
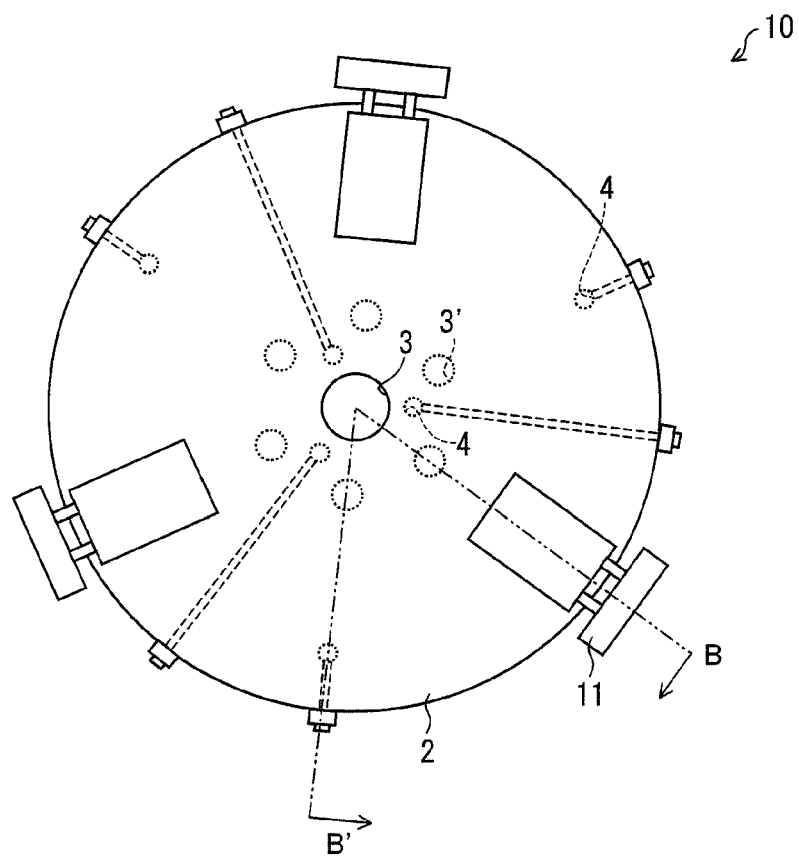
FIG. 4 is a top view of a separating apparatus according to Embodiment 2.
Figure 5:
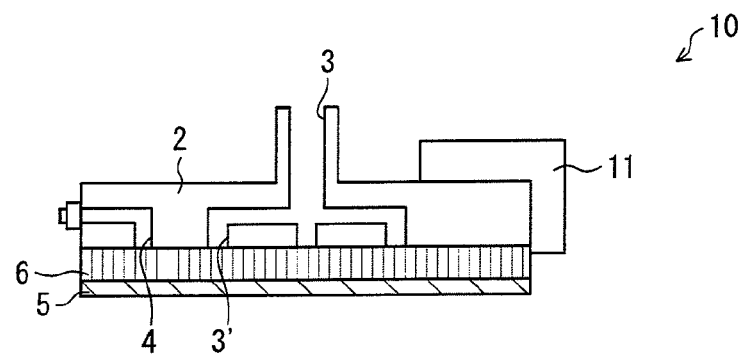
FIG. 5 is a cross-sectional view taken along the line B-B' of FIG. 4.

A separating apparatus 10 according to another embodiment of the present invention is described below with reference to FIGS. 4 and 5. FIG. 4 is a top view of the separating apparatus 10 according to Embodiment 2. FIG. 5 is a cross-sectional view taken along the line B-B' line of FIG. 5. As illustrated in FIGS. 4 and 5, the separating apparatus 10 includes a sucking plate 2 similarly to Embodiment 1. Furthermore, the separating apparatus 10 includes a clamp 11 for gripping an outer peripheral end of the support plate 6. As illustrated in FIG. 5, the separating apparatus 10 is provided so as to face the support plate 6, attached to the wafer 5, which is an object to be processed. In the present embodiment, the sucking plate 2 is similar to that of Embodiment 1, and as such, it is not specifically described.

(Clamp 11)

The clamp 11 grips only an outer peripheral end of the support plate 6 attached to the wafer 5 and does not make contact with the wafer 5. It is only necessary that the clamp 11 grip the outer peripheral end of the support plate 6. However, it is particularly preferable that the clamp 11 grip a chamfered portion of the outer peripheral end of the support plate 6. The support plate 6 for supporting the wafer 5 is usually realized by a glass plate or the like, and such a plate has an outer peripheral end chamfered so as to be curved. By gripping this chamfered portion, the clamp 11 more securely grips the support plate 6. The clamp 11 includes a claw that makes contact with the chamfered portion of the support plate 6. The clamp 11 may also be arranged to grip the support plate 6 in such a way as to hook the claw onto the chamfered portion.

In order for the claw of the clamp 11 to be securely hooked onto the chamfered portion of the support plate 6, it is preferable that a surface of the claw which surface makes contact with the chamfered portion be inclined at 45 to 90 degrees, more preferably at approximately 63 degrees, to a contact surface of the chamfered portion which contact surface makes contact with the claw. Moreover, it is preferable that (i) a surface of the claw opposite to the surface that makes contact with the chamfered portion, i.e., a lower surface of the claw and (ii) a surface of the support plate 6 which surface has been attached to the wafer 5 be in the same plane (flush with each other). This makes it possible to grip only the support plate 6 without hooking the claw onto the wafer 5 or a dicing tape attached to the wafer.

The clamp 11 moves toward or away from the outer peripheral end of the support plate 6 in a direction parallel to the surface of the support plate 6 which surface has been attached to the wafer 5. In gripping the support plate 6, the clamp 11 moves toward the outer peripheral end of the support plate 6 in the direction parallel to the aforementioned surface to grip the outer peripheral end. Such a configuration allows suitably gripping support plates 6 of various sizes.

In the present embodiment, as illustrated in FIG. 4, there are three clamps 11 provided on the sucking plate 2 at regular intervals. There may be provided two clamps or four or more clamps. The number of clamps 11 is not limited provided that the support plate 6 can be stably gripped. Accordingly, the separating apparatus 10 is arranged such that the plurality of clamps 11 grip the outer peripheral end of the support plate 6 from multiple directions so as to pinch the support plate 6.

Also in the present embodiment, the support plate 6 has a plurality of through holes passing therethrough in a thickness direction thereof. Gas to be supplied to the support plate 6 via the gas inlet 4 of the gas supply means provided on the sucking plate 2 is supplied into a space between the support plate 6 and the wafer 5 via the through holes of the support plate 6.

In separating the support plate 6 from the wafer 5, the separating apparatus 10 uses the sucking plate 2 to hold the support plate 6 by suction and then uses the clamp 11 to grip the outer peripheral end of the support plate 6 held by the sucking plate 2. That is, the separating apparatus 10 supports the support plate 6 by sticking the sucking plate 2 to the support plate 6 by suction and using the clamp 11 to grip the outer peripheral end of the support plate 6. This allows more securely holding the support plate 6 and separating the support plate 6 without putting stress on the wafer 5.

(Separating Method)

A separating method that involves the use of the separating apparatus 10 according to the present embodiment is practiced similarly to the separating method of Embodiment 1, other than the step of gripping the support plate 6 by the clamp 11. Therefore, the steps other than the step of gripping the support plate 6 are not specifically described.

In the separating method of the present embodiment, after a laminate constituted by the wafer 5, the support plate 6, and the dicing tape 7 is fixed on the stage 8, the sucking plate 2 provided with the clamp 11 is placed above the support plate 6 so that the support plate 6 and the sucking plate 2 face each other. Then, after or at the same time as the gas is expelled from the space between the sucking plate 2 and the support plate 6 and the sucking plate 2 holds the support plate 6 by sticking to the support plate 6 by the suction power with which the gas is expelled, gas is supplied into the space between the wafer 5 and the support plate 6 via the gas inlet 4. Subsequently, by moving the clamp 11 toward the support plate 6 so as to cause the clamp 11 to grip the outer peripheral end of the support plate 6, the support plate 6 is separated from the wafer 5 similarly to Embodiment 1.

The present invention is not limited to the description of the embodiments above, but may be altered by a skilled person within the scope of the claims. An embodiment based on a proper combination of technical means disclosed in different embodiments is encompassed in the technical scope of the present invention.

Since the separating apparatus according to the present invention can easily separate a supporting plate from a substrate without putting stress on the substrate, the separating apparatus can be suitably applied, for example, to manufacture of miniaturized semiconductor devices.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

The invention claimed is:

1. A separating apparatus for separating a supporting plate from a substrate to which the supporting plate has been attached, comprising:

a sucking device configured to stick to the supporting plate by suction, and form a space therebetween, the supporting plate having a plurality of through holes passing therethrough in a thickness direction thereof, said sucking device having an opening via which gas is capable of being expelled from the space between said sucking device and the supporting plate, said opening having a diameter of not less than 0.3 mm and not more than an outer diameter of the supporting plate;

a gas supply means for supplying gas into a space between the supporting plate and the substrate via the through holes;

wherein said opening via which gas is capable of being expelled is disposed in a position so as to overlap with at least one of said plurality of through holes of said supporting plate while gas is being supplied into the space between the supporting plate and the substrate with said gas supply means; and wherein said sucking device is configured to hold said supporting plate by a sucking force which is caused by expelling gas from a space between said sucking device and said supporting plate.

2. The separating apparatus as set forth in claim 1, wherein said opening has a diameter of not less than 0.3 mm and not more than 20 mm.

3. The separating apparatus as set forth in claim 1, wherein said opening in said sucking device is one of a plurality of openings.

4. The separating apparatus as set forth in claim 1, wherein said gas supply means starts supplying gas after or at the same time as said sucking device sticks to the supporting plate by suction.

5. The separating apparatus as set forth in claim 1, further comprising a dissolving liquid supply device configured to supply a dissolving liquid into the space between the supporting plate and the substrate via the through holes.

6. The separating apparatus as set forth in claim 1, further comprising a clamp configured to grip an outer peripheral end of the supporting plate.

7. The separating apparatus as set forth in claim 1, wherein said gas supply means includes a gas inlet that is separate from said opening.

8. The separating apparatus as set forth in claim 7, wherein said opening is disposed on a surface of said sucking device opposite a surface of said sucking device configured to stick to the supporting plate, and said gas inlet is disposed on a side surface of said sucking device.

* * * * *